(12) United States Patent
Kao et al.

(10) Patent No.: US 11,934,213 B2
(45) Date of Patent: Mar. 19, 2024

(54) LIQUID-COOLING DEVICE

(71) Applicant: ASIA VITAL COMPONENTS (CHINA) CO., LTD., Shenzhen (CN)

(72) Inventors: Pai-Ling Kao, Shenzhen (CN); Sung-Wei Lee, Shenzhen (CN); Kuan-Lin Huang, Shenzhen (CN); Ming-Tsung Yang, Shenzhen (CN)

(73) Assignee: ASIA VITAL COMPONENTS (CHINA) CO., LTD., Shenzhen (CN)

( * ) Notice: Subject to any disclaimer, the term of this patent is extended or adjusted under 35 U.S.C. 154(b) by 140 days.

(21) Appl. No.: 17/178,268

(22) Filed: Feb. 18, 2021

(65) Prior Publication Data
US 2022/0261019 A1 Aug. 18, 2022

(51) Int. Cl.
*G05D 23/12* (2006.01)
(52) U.S. Cl.
CPC .................................. *G05D 23/12* (2013.01)
(58) Field of Classification Search
CPC ... G05D 23/12; H01L 23/4332; H01L 23/473; H05K 1/0201; F28D 1/0316; F28D 2021/0029; F28F 3/12; F28F 9/26
See application file for complete search history.

(56) References Cited

U.S. PATENT DOCUMENTS

| 4,558,395 | A | * | 12/1985 | Yamada | H01L 23/4332 |
| | | | | | 257/E23.091 |
| 4,870,477 | A | * | 9/1989 | Nakanishi | H01L 23/433 |
| | | | | | 257/E23.091 |
| 4,977,444 | A | * | 12/1990 | Nakajima | H01L 23/4735 |
| | | | | | 361/689 |
| 5,465,192 | A | * | 11/1995 | Yoshikawa | H01L 23/433 |
| | | | | | 257/E23.09 |

FOREIGN PATENT DOCUMENTS

| CN | 108106473 A | 6/2018 |
| CN | 111981868 A | 11/2020 |
| TW | 200719806 A | 5/2007 |
| TW | 200821801 A | 5/2008 |
| TW | M611414 U | 5/2021 |

OTHER PUBLICATIONS

Search Report dated Sep. 27, 2021, issued by Taiwan Intellectual Property Office for counterpart application No. 110100618, 1 page.

* cited by examiner

*Primary Examiner* — Marc E Norman
(74) *Attorney, Agent, or Firm* — Bradley J. Thorson; DeWitt LLP

(57) ABSTRACT

A liquid-cooling device includes multiple water blocks and at least one connection tube. Each of the water blocks has a water incoming end, a water outgoing end and a water-receiving space in communication with the water incoming end and the water outgoing end. The connection tube is disposed between each two water blocks. Two ends of the connection tube are respectively connected with the water incoming end of one of the two water blocks and the water outgoing end of the other water block, whereby the water-receiving spaces of the two water blocks communicate with each other via the connection tube. The connection tube has at least one bellows section between two ends of the connection tube. The liquid-cooling device solves the problems of the conventional liquid-cooling device that when the water block is welded, thermal deformation is produced to cause tolerance and the manufacturing cost is higher.

4 Claims, 6 Drawing Sheets

LIQUID-COOLING DEVICE

BACKGROUND OF THE INVENTION

1. Field of the Invention

The present invention relates generally to a liquid-cooling device, and more particularly to a liquid-cooling device, which can solve the problems of the conventional liquid-cooling device that when the water block is welded with the straight copper tube, thermal deformation is produced to cause tolerance and the manufacturing cost is higher.

2. Description of the Related Art

Along with the great enhancement of the requirement for big data and cloud computing service, the requirement for heat dissipation of related electronic products has become higher and higher. Especially, with respect to the server (or so-called service device) of a large-scale operation center, the operation density is increased so that the waste heat generated in the space with the same size is greatly increased. In order to reduce the energy consumed in heat dissipation, the design of the heat sink has been gradually converted from the air-cooling of the conventional fan into liquid-cooling, in which a water block (plate) is used to carry the heat away from the server to dissipate the heat to the environment. This can solve the problem of high-density waste heat.

In the conventional air-cooling electronic product, each chip has one single corresponding heat sink. In case there are multiple chips in the system (such as a server), multiple air-cooling heat sinks are arranged in the system corresponding to the chips. However, with respect to a liquid-cooling or water-cooling product, it is necessary to arrange water pipelines in a limited space of the case. In the narrow space, the main factors affecting the arrangement of the pipelines are: the arrangement of the motherboard, the direction of the inlet and outlet of the water block, the inner and outer diameters of the pipelines, the minimum bending radius of the pipeline, etc. The conventional water block (plate) and the respective components (radiator and pump) are often serially connected via flexible rubber water hoses to form a water-cooling module. However, in installation, the connectors of the rubber water hoses are apt to detach to cause leakage due to water pressure or other problems. Moreover, the rubber water hoses are subject to affection of time and high temperature of the environment so that the rubber water hoses are apt to oxidize and crack to cause leakage. This often leads to damage of the electronic components in the server system.

Some manufacturers employ metal straight tubes (such as copper tubes) instead of the rubber water hoses to solve the problems of detachment due to water pressure as well as oxidization and leakage. Therefore, the existent water blocks (plates) positioned on the respective chips in such as the server are serially connected via straight copper tubes by means of welding. The water blocks are serially connected via the straight copper tubes to solve the above leakage problem. However, in use and assembling process of the straight copper tube, there is still a technical problem to be solved. That is, in assembling process, when one end of the straight copper tube is welded with the water block, thermal deformation is produced to cause tolerance. In this case, the other end of the straight copper tube can be hardly serially connected with another water block. This makes it impossible to assemble the liquid-cooling device with the system.

In order to solve this problem, it is often necessary to design a very precise welding tool and employ a quite skilled welding operator so as to reduce the thermal deformation and process the water block. However, this will prolong the total processing time and increase the welding cost.

The water block can be processed by means of the precise welding tool and the skilled welding operator. However, there is still a difficult situation to face. That is, there are still tolerances or differences of the distances between the respective chips and the heights of the perforations in each server. The straight copper tube itself has poor elasticity and can hardly provide sufficient elasticity to eliminate the tolerance of the respective parts so that after processed, the water blocks cannot be properly mounted on the corresponding chips. Due to this factor, the current products employing welded copper tubes cannot be effectively and widely applied to the water-cooling products of the server.

In conclusion, the conventional liquid-cooling device has some technical shortcomings as follows:

1. In the current welding technology, thermal stress and thermal deformation still will take place. As a result, the water block assembled by means of welding itself will be greatly deformed to cause tolerance. The straight copper tube itself has poor elasticity and thus cannot absorb the tolerance so that two ends of the straight copper tube cannot be serially connected with two water blocks by means of welding. Therefore, it is impossible to mount the water block in the system.
2. It is necessary to employ a quite skilled flame welding operator and a precise welding tool so as to reduce the thermal deformation. This will prolong the welding time, deteriorate the production efficiency and increase the cost. Also, the conventional liquid-cooling device cannot be applied to various liquid-cooling systems of different client ends.

SUMMARY OF THE INVENTION

It is therefore a primary object of the present invention to provide a liquid-cooling device, which can solve the problems of the conventional liquid-cooling device that when the water block is welded with the straight copper tube, thermal deformation is produced to cause tolerance and the manufacturing cost is higher.

It is a further object of the present invention to provide the above liquid-cooling device, which can enhance the production efficiency and increase the good product ratio.

It is still a further object of the present invention to provide the above liquid-cooling device, which includes at least one connection tube and two water blocks connected with two ends of the connection tube. The connection tube has at least one bellows section. The bellows section provides elasticity to absorb the tolerance caused by the thermal deformation produced after the water blocks and the connection tube are welded. Accordingly, the liquid-cooling device is applicable to different systems of various specifications or brands.

To achieve the above and other objects, the liquid-cooling device of the present invention includes multiple water blocks and at least one connection tube. Each of the water blocks has a water incoming end, a water outgoing end and a water-receiving space in communication with the water incoming end and the water outgoing end. The connection tube is disposed between each two water blocks. Two ends of the connection tube are respectively connected with the water incoming end of one of the two water blocks and the water outgoing end of the other water block, whereby the water-receiving spaces of the two water blocks communicate with each other via the connection tube. The connection tube has at least one bellows section positioned between two ends of the connection tube. The design of the liquid-cooling device solves the problems of the conventional liquid-cooling device that when the water block is welded with the straight copper tube, thermal deformation is produced to cause tolerance and the manufacturing cost is higher. Also, the liquid-cooling device of the present invention effectively enhances the production efficiency and increases the good product ratio.

In the above liquid-cooling device, the connection tube has a first connection end, a second connection end, a first straight section and a second straight section. The first connection end is in connection and communication with the water incoming end of one of the two water blocks. The second connection end is in connection and communication with the water outgoing end of the other of the two water blocks. Two sides of the bellows section are respectively connected with the first and second straight sections.

In the above liquid-cooling device, the bellows section has multiple waved stripes arranged at intervals (or continuously). Each two waved stripes define therebetween a waved stripe pitch. The waved stripe pitches are equal to or unequal to each other.

In the above liquid-cooling device, the multiple waved stripes are annular waved stripes or spiral waved stripes.

In the above liquid-cooling device, the connection tube is connected with the two water blocks by means of welding or diffusion bonding.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
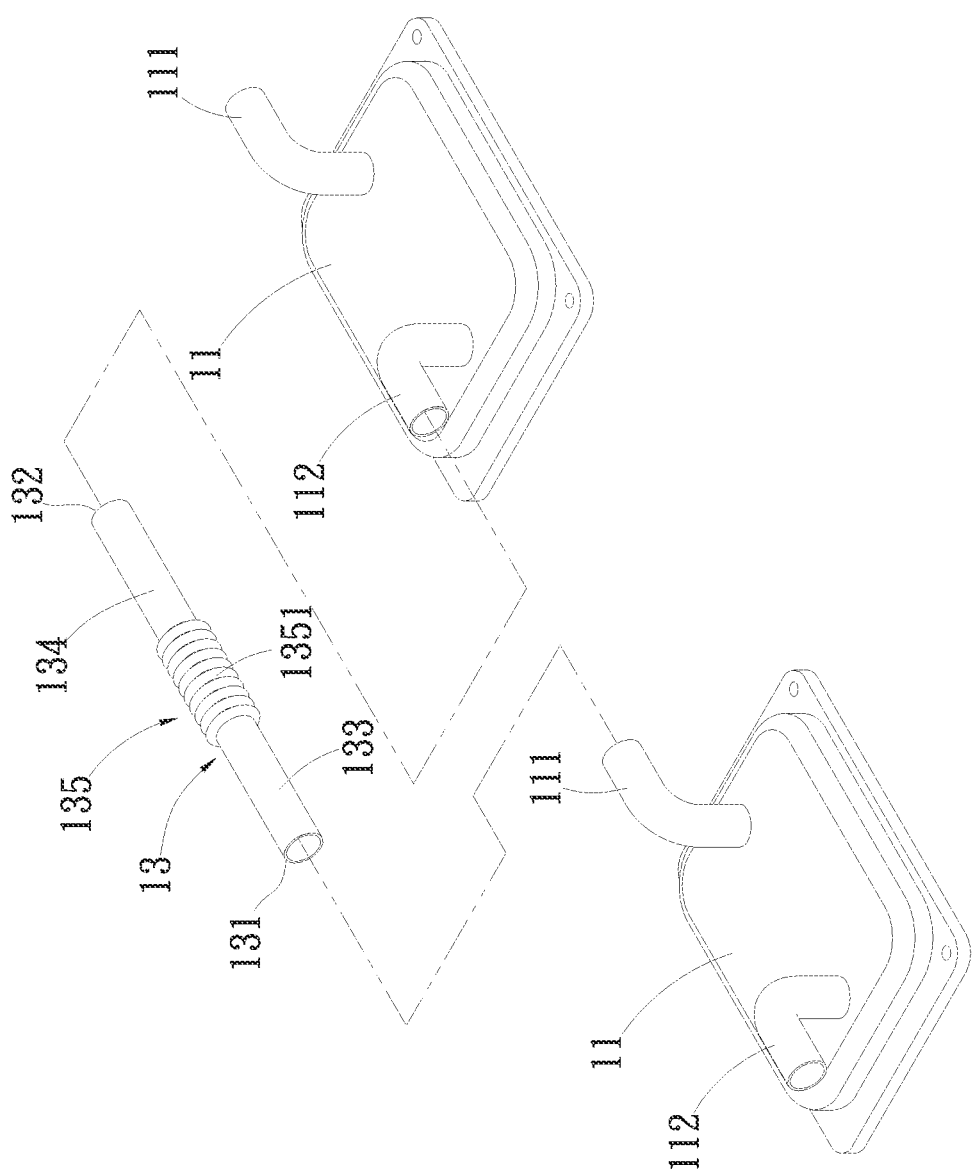
FIG. 1 is a perspective exploded view of a preferred embodiment of the liquid-cooling device of the present invention.

Please refer to FIGS. 1, 2A, 2B and 3. The liquid-cooling device 1 of the present invention includes multiple water blocks 11 and at least one connection tube 13. In this embodiment, the liquid-cooling device 1 selectively includes two water blocks 11 for illustration. The number of the water blocks 11 is not limited to two. The liquid-cooling device 1 is applied to an IT device or a server system to dissipate the heat generated by the heat generation components 2 (such as central processing unit and graphics processing unit) in the IT device or server system. The number of the water blocks 11 is previously determined to be equal to the number of the heat generation components 2. For example, the base seats of three water blocks 11 are respectively cooperatively attached to the upper surfaces of three corresponding heat generation components 2. Each two water blocks 11 are serially connected and communicated via the connection tube 13 therebetween.

The water block 11 is composed of an upper case and a base seat mated with each other. The water block 11 has a water incoming end 111, a water outgoing end 112 and a water-receiving space 113. In this embodiment, the water incoming end 111 and the water outgoing end 112 are formed on the top side of the water block 11 (the upper outer side of the upper case) in communication with the water-receiving space 113 in the water block 11. A working liquid 4 (such as pure water) can pass through the water-receiving space 113.

The connection tube 13 is disposed between each two water blocks 11. Two ends of the connection tube 13 are respectively connected with the water incoming end 111 of one of the two water blocks 11 and the water outgoing end 112 of the other water block 11, whereby the water-receiving spaces 113 of the two water blocks 11 communicate with each other via the connection tube 13 (as shown in FIG. 2B). In this embodiment, the connection tube 13 is, but not limited to, connected with the two water blocks 11 by means of welding. Alternatively, the connection tube 13 can be connected with the two water blocks 11 by means of diffusion bonding, insertion or screwing.

Figure 2A:
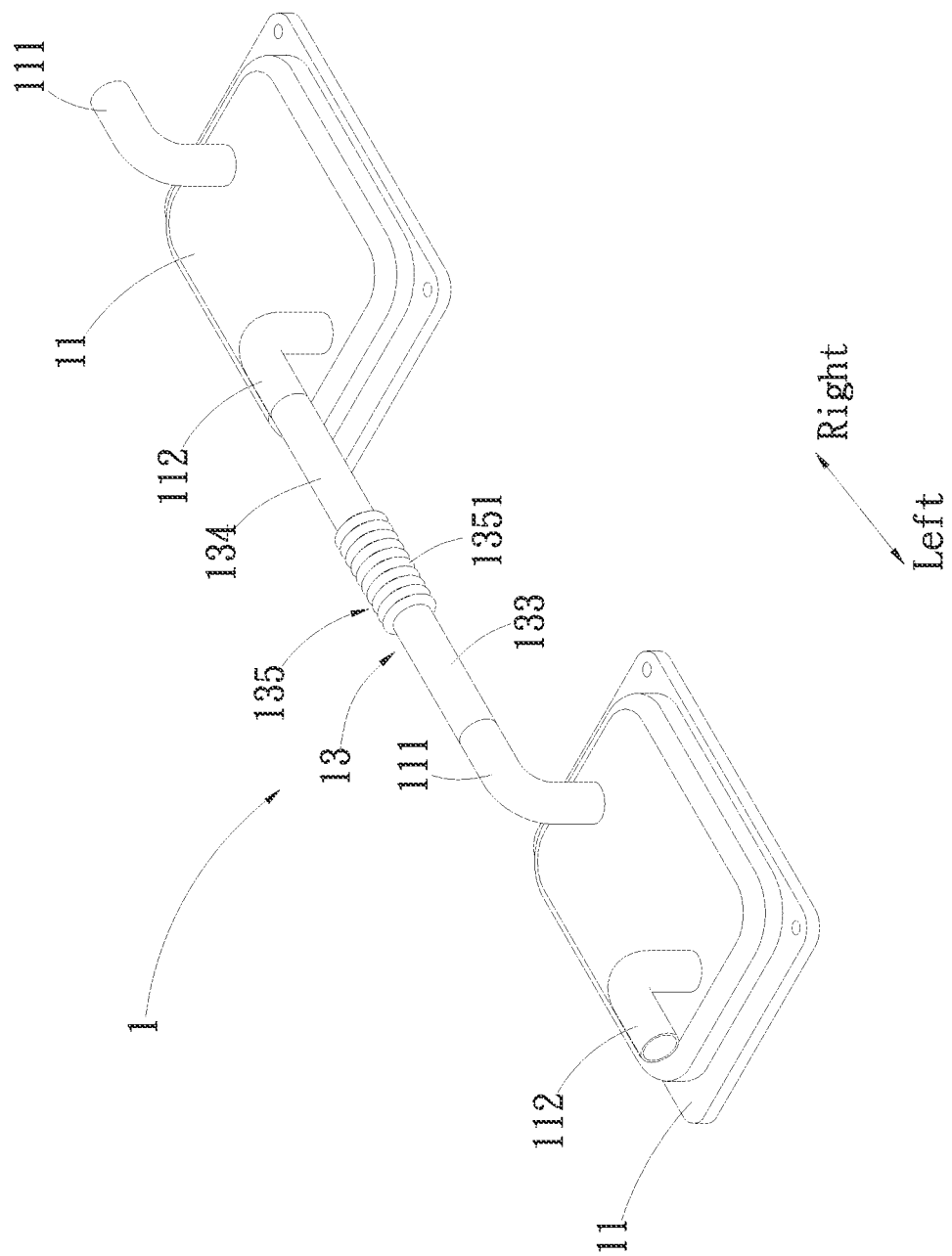
FIG. 2A is a perspective assembled view of the preferred embodiment of the liquid-cooling device of the present invention, showing the bellows section in an aspect.
Figure 2B:
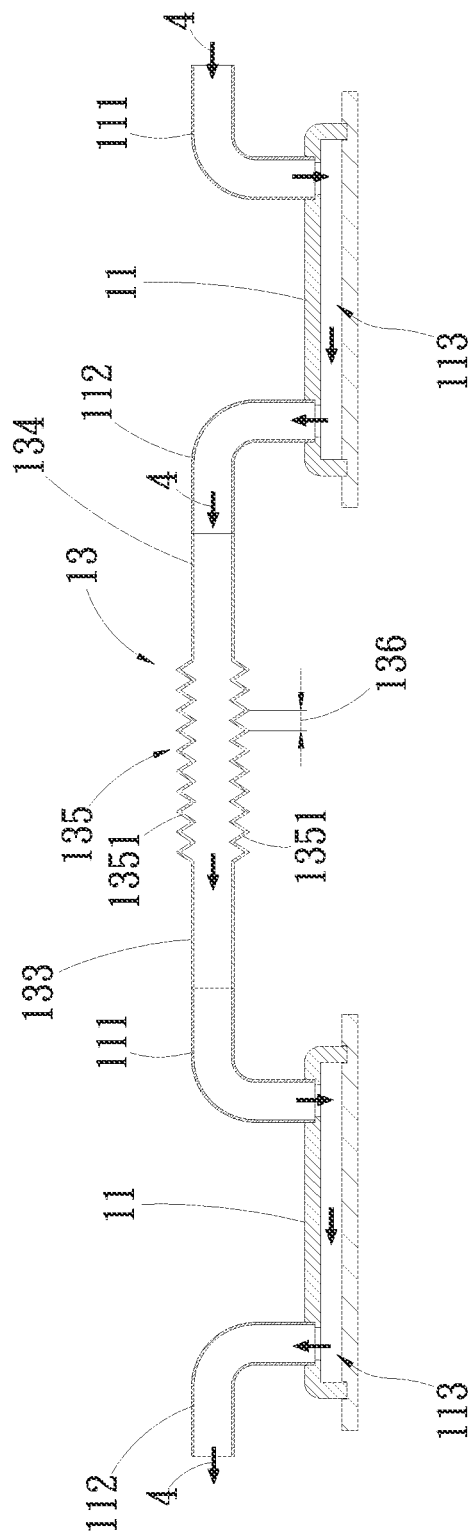
FIG. 2B is a sectional view according to FIG. 2A.
Figure 2C:
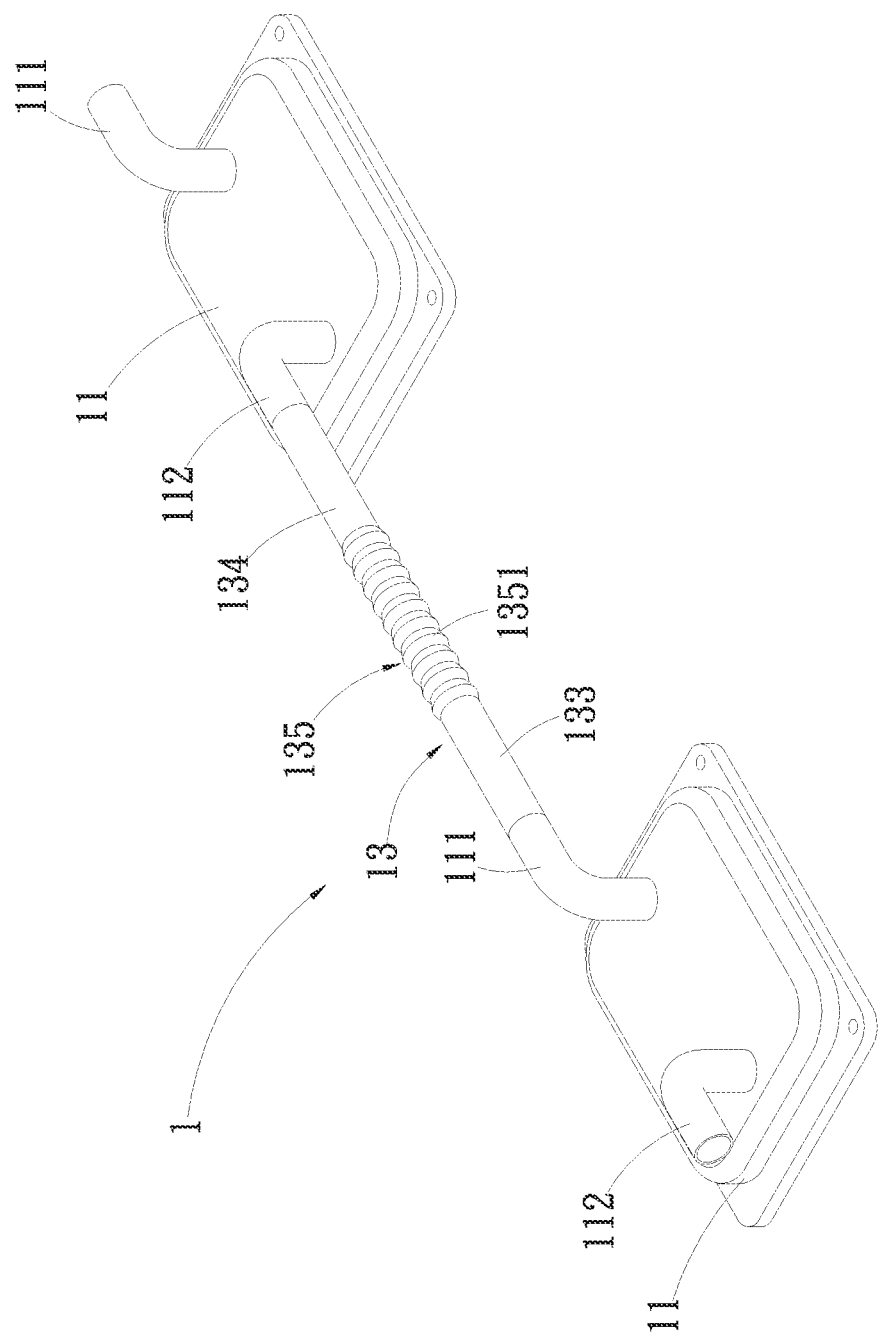
FIG. 2C is a perspective assembled view of another preferred embodiment of the liquid-cooling device of the present invention, showing the bellows section in another aspect.

Please further refer to FIGS. 2A, 2B and 2C. The connection tube 13 has a first connection end 131, a second connection end 132, a first straight section 133, a second straight section 134 and at least one bellows section 135. In this embodiment, the first connection end 131 is in connection and communication with the water incoming end 111 of the first water block 11 (such as the left water block 11 of FIG. 2A) by means of welding. The second connection end 132 is in connection and communication with the water outgoing end 112 of the second water block 11 (such as the right water block 11 of FIG. 2A) by means of welding. Accordingly, the working liquid 4 in the water-receiving space 113 of the second water block 11 can pass through the water outgoing end 112, the second and first connection ends 132, 131 of the connection tube 13 and the water incoming end 111 of the first water block 11 to flow into the water-receiving space 113 of the first water block 11. In practice, the water outgoing end 112 of the first water block 11 and the water incoming end 111 of the second water block 11 are connected to a water-cooling heat dissipation unit (such as composed of a heat dissipation radiator and a pump, not shown) with multiple radiating fins via multiple water conduits 3 (such as water tubes), whereby a water-cooling (liquid-cooling) circular heat dissipation effect can be achieved.

The bellows section 135 is positioned between two ends of the connection tube 13. In this embodiment, the bellows section 135 has multiple annular waved stripes 1351 and two sides of the bellows section 135 are respectively connected with the first and second straight sections 133, 134. The waved stripes 1351 of the bellows section 135 are arranged at intervals (or continuously), whereby the bellows section 135 itself is bendable and has excellent elasticity to achieve shock absorption effect.

In addition, each two waved stripes 1351 define therebetween a waved stripe pitch 136. In this embodiment, the waved stripe pitches 136 are equal to each other. In a modified embodiment, some (such as the left half) of the waved stripe pitches 136 are selectively equal to each other and the others (such as the left half) of the waved stripe pitches 136 are unequal to each other. Alternatively, all the waved stripe pitches 136 are unequal to each other. In another embodiment, the heights of the multiple waved stripes 1351 are gradually increased from the left side to the right side of the bellows section 135, (for example, gradually increased from one side in adjacency to the first straight section 133 to one side in adjacency to the second straight section 134). Alternatively, the heights of the multiple waved stripes 1351 are gradually increased from the right side to the left side of the bellows section 135. Still alternatively, the heights of the multiple waved stripes 1351 are gradually increased from the middle to the left and right sides of the bellows section 135. Accordingly, the connection tube 13 can be freely bent (flexed) by any angle without interference between the waved stripes 1351. Also, the connection tube 13 can be extended/contracted to adjust the length and enlarge the use range.

Therefore, the bellows section 135 has elasticity to absorb the tolerance caused by the thermal deformation produced after the multiple water blocks 11 and the connection tube 13 are welded. Also, the tolerances of the distances between the chips and the perforations in the server system can be absorbed, whereby the liquid-cooling device 1 can be successfully mounted in the server system and all the water blocks 11 can in tight contact and attachment with the corresponding heat generation components 2.

In a preferred embodiment, the bellows section 135 has spiral waved stripes.

Figure 2D:
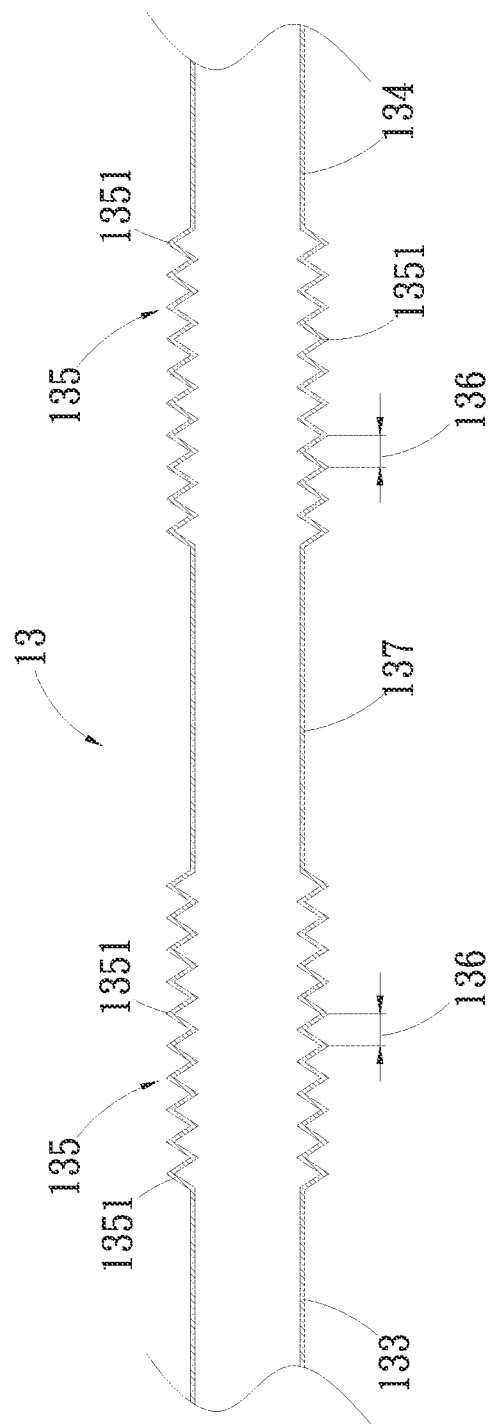
FIG. 2D is a partially sectional view of another embodiment of the liquid-cooling device of the present invention, showing the bellows sections thereof.
Figure 3:
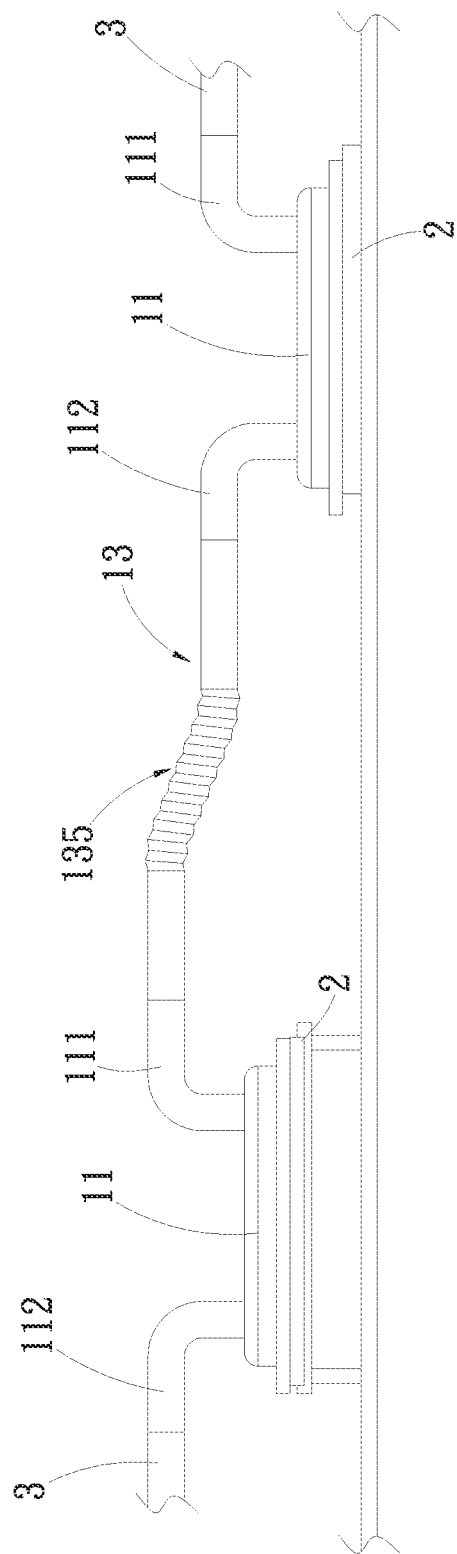
FIG. 3 is a side view showing that the liquid-cooling device of the present invention is applied to the heat generation components.

In some other embodiments, the connection tube 13 has multiple bellows sections 135 and multiple straight sections. The multiple bellows sections 135 are disposed between the first and second connection ends 131, 132 of the connection tube 13 at intervals (or continuously). Each two bellows sections 135 are connected by a straight section therebetween as shown in FIG. 2D. Two sides of one of the two bellows sections 135 are connected with one side of the first straight section 133 and one side of the third straight section 137. Two sides of the other of the two bellows sections 135 are connected with one side of the second straight section 134 and the other side of the third straight section 137, and so on. Therefore, the multiple bellows sections 135 disposed on the connection tube 13 can provide elasticity to achieve more deformation room and enlarge the allowable range for absorbing the tolerance. Accordingly, it can be ensured that the liquid-cooling device 1 is positioned in the originally designed system (such as the server system) corresponding to the set positions of the heat generation components.

According to the design of the liquid-cooling device 1 of the present invention, the present invention effectively improves the shortcoming of the conventional liquid-cooling device that when the water block is welded with the straight copper tube, thermal deformation is produced to cause tolerance and in the transfer process, the water block and the straight copper tube are subject to vibration and collision to cause deformation so that it is impossible to mount the liquid-cooling device in the system. In addition, in the present invention, the bellows section 135 of the connection tube 13 provides elasticity to absorb the tolerance caused by the thermal deformation produced when the water blocks 11 and the connection tube 13 are welded. Also, the tolerances of the distances between the chips in the system can be absorbed, whereby the liquid-cooling device 1 of the present invention can be successfully mounted in the system (such as a server) with various specifications or brands. Moreover, the liquid-cooling device 1 of the present invention is adapted and applicable to various circuit boards (not shown) in various systems or the electronic components on the circuit boards with height differences. Therefore, the present invention is applicable to various systems without the existent high-cost welding tool and skilled welding operator. Accordingly, the present invention can truly greatly lower the manufacturing cost, enhance the production efficiency and increase the good product ratio.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A liquid-cooling device comprising:
a plurality of water blocks, each water block having a water incoming end, a water outgoing end and a water-receiving space in communication with the water incoming end and the water outgoing end for a working liquid to pass through, the water incoming end and the water outgoing end being respectively and independently formed on a top side of the water block and protruded outward from the top side; and
at least one connection tube disposed between every two adjacent water blocks of the plurality of water blocks, the connection tube having a first straight section, a second straight section and at least one bellows section, the bellows section having two opposing ends, the first straight section having a first end and a second opposing end, the second straight section having a first end and a second opposing end, the first end of the first straight section being connected with one of the opposing ends of the bellows section and the first end of the second straight section being connected with the other of the opposing ends of the bellows section, the second end of the first straight section being connected with the water incoming end of a first water block of the two adjacent water blocks, and the second end of the second straight section being connected with the water outgoing end of a second water block of the two adjacent water blocks, such that the working liquid in the water-receiving space of the first water block can pass through the second outgoing end, the second and first connection ends of the connection tube and the water incoming end of the second water block to flow into the water-receiving space of the second water block, whereby the water-receiving spaces of the two adjacent water blocks communicate with each other via the connection tube.

2. The liquid-cooling device as claimed in claim 1, wherein the bellows section has multiple waved stripes, each two successive waved stripes defining therebetween a waved stripe pitch, the waved stripe pitches being equal to or unequal to each other.

3. The liquid-cooling device as claimed in claim 1, wherein the multiple waved stripes are annular waved stripes or spiral waved stripes.

4. The liquid-cooling device as claimed in claim 1, wherein the connection tube is connected with the two water blocks by means of welding, insertion, screwing or diffusion bonding.

* * * * *